United States Patent
Hynecek

(10) Patent No.: US 7,139,023 B2
(45) Date of Patent: Nov. 21, 2006

(54) HIGH DYNAMIC RANGE CHARGE READOUT SYSTEM

(75) Inventor: Jaroslav Hynecek, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 976 days.

(21) Appl. No.: 09/802,556

(22) Filed: Mar. 12, 2001

(65) Prior Publication Data

US 2002/0126213 A1    Sep. 12, 2002

(51) Int. Cl.
   *H04N 5/335*    (2006.01)
(52) U.S. Cl. .................. 348/303; 348/311; 348/313; 257/223; 257/230
(58) Field of Classification Search ........... 348/294, 348/299, 303, 304, 311, 323, 313, 314, 315, 348/241, 295; 257/225–234
See application file for complete search history.

(56) References Cited

U.S. PATENT DOCUMENTS

| | | | | |
|---|---|---|---|---|
| 4,873,561 A | * | 10/1989 | Wen | 377/62 |
| 5,337,340 A | * | 8/1994 | Hynecek | 377/60 |
| 5,652,442 A | * | 7/1997 | Roks | 257/239 |
| 5,867,215 A | * | 2/1999 | Kaplan | 348/315 |
| 6,392,260 B1 | * | 5/2002 | Farrier et al. | 257/215 |
| 6,444,968 B1 | * | 9/2002 | Burt et al. | 250/208.1 |

* cited by examiner

*Primary Examiner*—Tuan Ho
*Assistant Examiner*—Chriss S. Yoder
(74) *Attorney, Agent, or Firm*—Alan K. Stewart; W. James Brady; Frederick J. Telecky, Jr.

(57) ABSTRACT

A solid-state image sensor has a readout architecture that incorporates charge multiplier cells into a horizontal register of a CCD image sensor, and includes a first CCD register adjacent to at least a second CCD register and coupled to the said first register through a charge overflow barrier. A high Dynamic Range readout system results in which the DR is not restricted by the voltage swing limitations on the charge detection node. As the charge is multiplied, the horizontal register structure increases in width and more charge multiplication gates are added per stage. A charge overflow region follows the charge multiplier. In this region the amount of charge that exceeds a certain predetermined threshold is split off into another register. A detection node that has different conversion sensitivity may terminate this register. The process of charge overflow and splitting off may continue for more than two steps.

7 Claims, 4 Drawing Sheets

HIGH DYNAMIC RANGE CHARGE READOUT SYSTEM

FIELD OF THE INVENTION

The invention relates to solid-state image sensors, and more particularly to image sensors that have a readout architecture that incorporates charge multipliers that have high DR with large charge handling capabilities, and that extends the charge Dynamic Range (DR) of the sensor thus increasing the demand on the DR of charge readout systems.

DESCRIPTION OF RELATED ART

A typical image sensor senses light by converting impinging photons into electrons that are integrated (collected) in sensor pixels. After the integration cycle is completed, the charge is converted into a voltage that is supplied to the output terminals of the device. Charge to voltage conversion is accomplished either directly in the sensor pixels, such as in the Active Pixel CMOS image sensors, or remotely off the sensing area, in charge conversion amplifiers. In the remote conversion approach, the charge must be transported to the sensing amplifier by a well know charge transferring process using various vertical and horizontal Charge Coupled Device (CCD) registers.

U.S. Pat. No. 5,337,340, teaches the basic concept of charge carrier multiplication that can be used in a typical CCD register. The multiplication is based on a single carrier impact ionization that is induced by application of suitable clocking voltages to the various device gates. The suitable clocking voltages generate high fields in the structure and when a carrier is injected into these high field regions, it gains energy and may cause impact ionization. This process thus increases the original number of carriers that arrive at the charge detection amplifier. This is a desirable effect since the carrier multiplication that is based on single carrier impact ionization is almost noiseless. It is much easier to detect many electrons per single received photon than a single electron by the current state of the art charge detection amplifiers. The noise floor of the present day charge conversion amplifiers is approximately 10 electrons, and cannot be easily reduced.

Charge multiplication, however, presents a problem for the design of the CCD registers. As the number of transported carriers gradually increases, larger and larger wells need to be used. This may not be easily accomplished in the registers that are restricted in both dimensions by the sensor pixel size. Examples are the vertical registers in Frame Transfer (FT) sensors, Time Delay Integrate (TDI) sensors, or Interline Transfer (IT) sensors. It is thus desirable to incorporate most of the charge multiplication function in the horizontal CCD registers where the width is restricted only in one dimension.

A second problem resulting from charge multiplication is related to the DR of charge conversion structures at the input of the charge detection amplifier. Typically, the charge is transferred on a suitable charge detection node where the capacitance converts the arrived charge into an increment of voltage. It is desirable to have high sensitivity and low noise for charge conversion. This dictates a very small value for the node capacitance. However, when the charge is multiplied, the voltage increment may be so large that the detection node cannot handle it. The available maximum voltage swing thus unduly limits the DR of the sensor.

The third problem addressed in this invention relates to charge multiplier orientation on the semiconductor substrate. As theoretically described in the book "Semiconductor Transport" by David K. Ferry, published by Taylor and Francis in 2000, p 249, the multiplication threshold may depend on the crystallographic orientation. The voltage amplitude of the multiplication pulses that are applied to the multiplication gates may therefore depend on whether the CCD register is oriented in the <100>, <110>, or <111> direction. Actually it is the injection of electrons and their direction of movement in the high electrical field that is important, not the register orientation itself. However, in most CCD registers, the high field and the injection of electrons progresses along the length of the register. Since charge multiplication noise may also depend on the crystallographic orientation, it may be preferable to minimize noise rather than the charge multiplication pulse amplitude. This invention, therefore, defines the concept that certain register orientations and material crystallographic planes are preferable for noise and pulse amplitude minimization, and that these orientations may not be identical.

It is the purpose of this invention to define structures that overcome these limitations and achieve high dynamic range readout capability with low noise. The prior art does not show in detail how to incorporate the charge multiplication structure into a serial register of a typical image sensor and how to accommodate the gradually increasing number of carriers. The prior art also does not teach how to design a charge readout system that has high DR and that is not restricted by the maximum allowable voltage swing on the charge detection node. Finally the prior art does not teach that charge multiplication pulse voltage and charge multiplication noise may depend on crystallographic orientation and that certain CCD register or register pixel orientations are preferable for the best noise or pulse amplitude performances.

SUMMARY OF THE INVENTION

The present invention defines structure in CCDs that overcome limitations in the prior art. The invention provides a practical high DR readout system in which the DR is not restricted by the voltage swing limitations on the charge detection node. It defines a practical high performance image sensors of various architectures that have high DR. These structural advances are achieved by incorporating Charge Multiplier cells into a horizontal register of a CCD image sensor. As the charge is multiplied, the horizontal register is correspondingly increased in width and more charge multiplication gates are added per stage. A charge overflow region then follows the charge multiplier. In this region the amount of charge that exceeds a certain predetermined threshold is split off into another register. A detection node that has different conversion sensitivity may terminate this register. The process of charge overflow and splitting off can continue for more that two steps. As a result, the dynamic range of the sensor can be almost arbitrarily compressed with a predetermined charge to voltage transfer characteristic directly in the charge domain. Charge domain DR compression allows full utilization of the high DR obtained by the charge multiplier without imposing stringent demands on the DR of charge detection nodes and amplifiers. Finally, the orientation of charge multiplying registers themselves with respect to certain crystallographic directions of the semiconductor substrate are optimized for minimum pulse amplitude and minimum noise.

DETAILED DESCRIPTION OF PREFERRED EMBODIMENT

Figure 1:
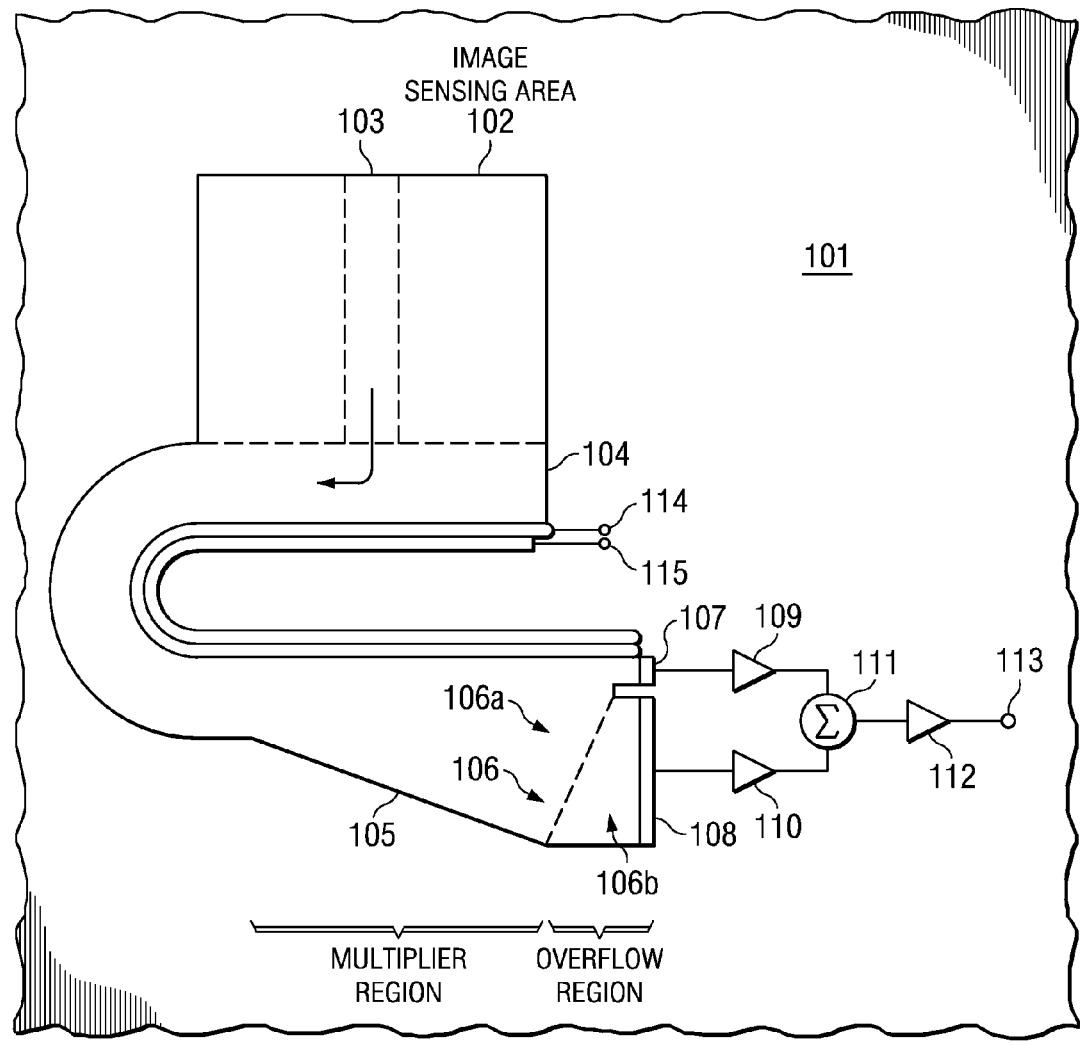
FIG. 1 is a plan view of the typical area image sensor showing the location of charge multiplier and charge overflow region in the horizontal CCD register.

In FIG. 1, a plan view of a typical CCD area image sensor architecture is shown. The semiconductor substrate is indicated as the region 101 where the active areas of the sensor are enumerated. The region 102 is the active image sensing area that is divided into individual pixels by channel stops and transfer gates. Both the channel stops and the gates are not shown to simplify the drawing.

There are many types of image sensor architectures ranging from Frame Transfer to Interline Transfer with single horizontal register or multiple registers that can be used here. However, these options will not be discussed here any further to simplify the description. It is clear to those skilled in the art that the present invention can apply to all of them.

The region 103 in FIG. 1 represents one vertical column of pixels that interfaces with the horizontal register 104. When the image area gates are clocked, the charge from one row of pixels is transferred into the horizontal register 104. Subsequently, by applying clock pulses to the gates of horizontal register 104, the charge is transported in the horizontal direction through the charge-multiplying region 105 where it becomes multiplied. After the charge exits from the multiplying region 105 it enters the charge overflow region 106. In this region the charge of each pixel is separated into at least two different channels, 106a and 106b, depending on its quantity. If the amount of charge is small, it remains confined in the high sensitivity channel 106a and is transported into the high sensitivity output charge detection node 107. However, when the quantity of charge exceeds a certain limit (charge handling capacity of the high sensitivity channel) the excess over this limit spills into the low sensitivity channel 106b. The excess charge is then transported in the low sensitivity channel 106b into the low sensitivity charge detection node 108. High sensitivity node amplifier 109 and the low sensitivity node amplifier 110 then buffer the voltage of the corresponding charge detection nodes and deliver it to the signal summing network 111. The resulting signal is then buffered by the output buffer amplifier 112 and supplied to the device output terminal 113.

The serial register 104, shown in FIG. 1, has also incorporated into it a clearing gate 114 and a clearing drain 115. Gate 114 and drain 115 may be used for removing charge from the register laterally by a single pulse applied to the clearing gate 114. This feature is standard in many image sensors produced today and it is not essential to the function of the described invention. It will, therefore, not be described here any further.

The separation of charge into the high sensitivity 106a and low sensitivity 106b channels, directly in the charge domain, is the key feature of the high Dynamic Range charge sensing system. Charge conversion gain of the high sensitivity channel 106a can be maintained high without worries about the charge detection node and amplifier saturation. When the spillover threshold is reached no more charge will be delivered to the high sensitivity output 107 and the output will remain at a constant level. The signal continues to be read out from the low sensitivity output 108 with no danger of saturation. More than two channels are possible with various sensitivities that can be pre-programmed during the sensor design. This allows the construct of an arbitrary piecewise linear transfer characteristic between input charge and the output signal that accomplishes an efficient charge domain Dynamic Range Compression. It is also clear to those skilled in the art that the signal-summing network 111 is not necessary. It is possible to output the signal directly from the individual amplifiers 109 and 110 and after suitable analog processing and digitization to perform the necessary signal processing in the digital domain.

Figure 2A:
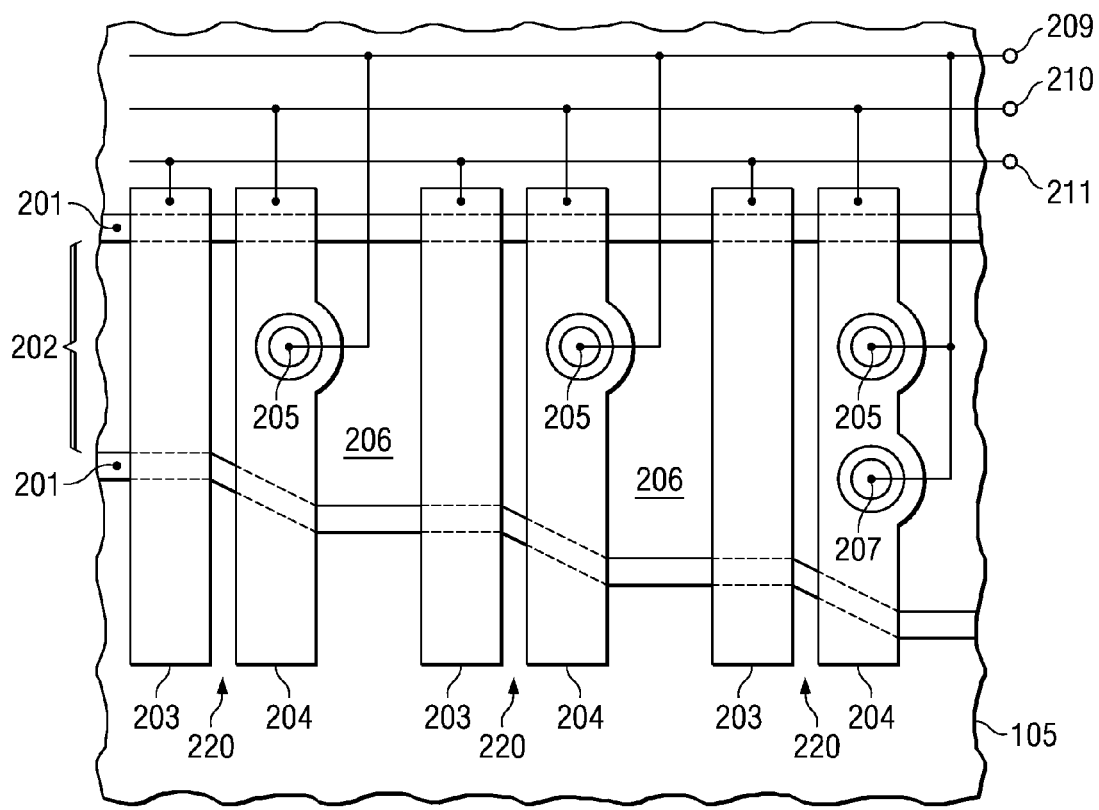
FIG. 2a shows the detail of the charge multiplier with a gradually increasing channel width and increasing number of multiplier gates per CCD stage.

The detail of charge Multiplier 105 that is incorporated in the CCD horizontal register is given in FIG. 2a. The charge is transported in the channel 202. Channel 202 is formed by ion implantation of suitable impurities into the substrate. The channel is further laterally defined by channel stops 201 that are also formed by implanting impurities into the substrate but of opposite type than the channel. Applying clocking pulses to the gates 203 and 204 transports the charge. The clocking signals are applied to the gates 203 and 204 through interconnections that are shown schematically and are sourced from the terminals 209, 210, and 211. The gates are formed, for example, from doped polysilicon and are deposited over the substrate and over the CCD channel as shown. A thin gate oxide separates the gates 203, 204 from the substrate 105. The gates 203, 204 are also separated from each other by narrow gaps 220. The regions 206 form the Virtual Phase regions that also store the charge. The Virtual Phase regions 206 are formed by implanting the regions 206 with a shallow doping profile over the channel with the same type of impurities as the channel stops. Charge multiplication is accomplished by applying a relatively large clock pulse to the approximately circular gates 205. As the quantity of charge increases, it is necessary to widen the charge transport channel 202. This is accomplished by shaping the channel stops 201 as is indicated in FIG. 2a. As the charge quantity increases from stage to stage it is also necessary to increase the charge holding capacity of the Charge Multiplication (CM) gates 205. This can be easily accomplished by either enlarging the gates 205 themselves, or by adding more gates 207 as indicated. The process of widening the channel and adding more CM gates can continue as needed down the CCD register. The register width increase, however, does not need to be linear, it may be exponential, dependent upon the number of stages.

Figure 2B:
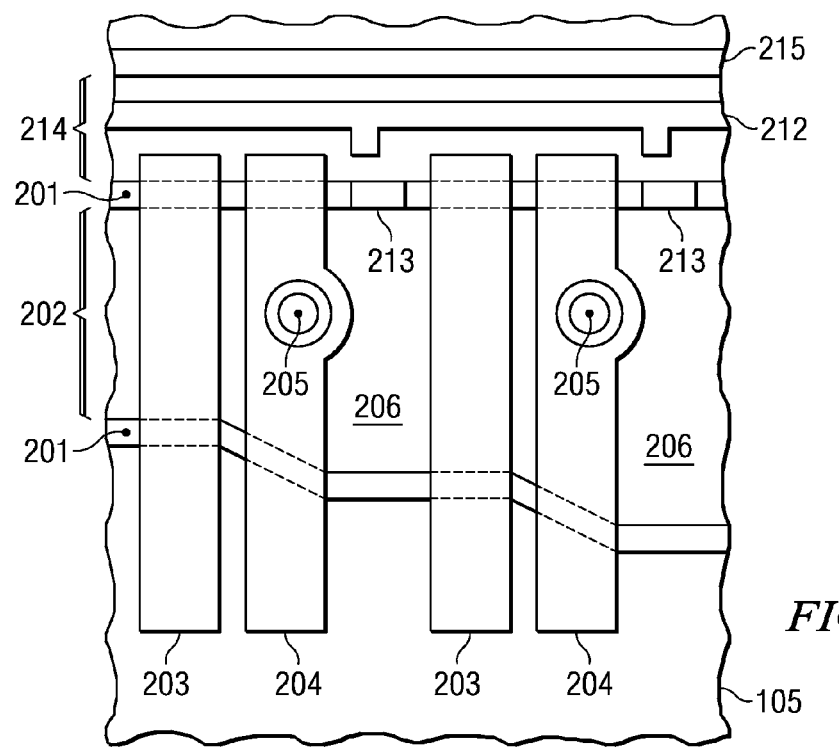
FIG. 2b shows the charge multiplier with a gradually increasing channel width and with an overflow barrier and drain to prevent blooming.

It is also advantageous to incorporate a blooming protection into the charge multiplier. This is shown in FIG. 2b where another channel 214 was created next to the channel 202 and defined by another channel stop region 215. A charge drain 212 is placed into this channel to collect overflow charge from the register. Replacing the channel stop doping in the region 213, by suitable implants that define the threshold for charge overflow, creates the overflow barrier in the region 213. When the charge in the channel exceeds the overflow level, it is collected by the drain 212 and prevented from spreading down the channel and contaminating neighboring pixels. This prevents blooming.

Figure 3:
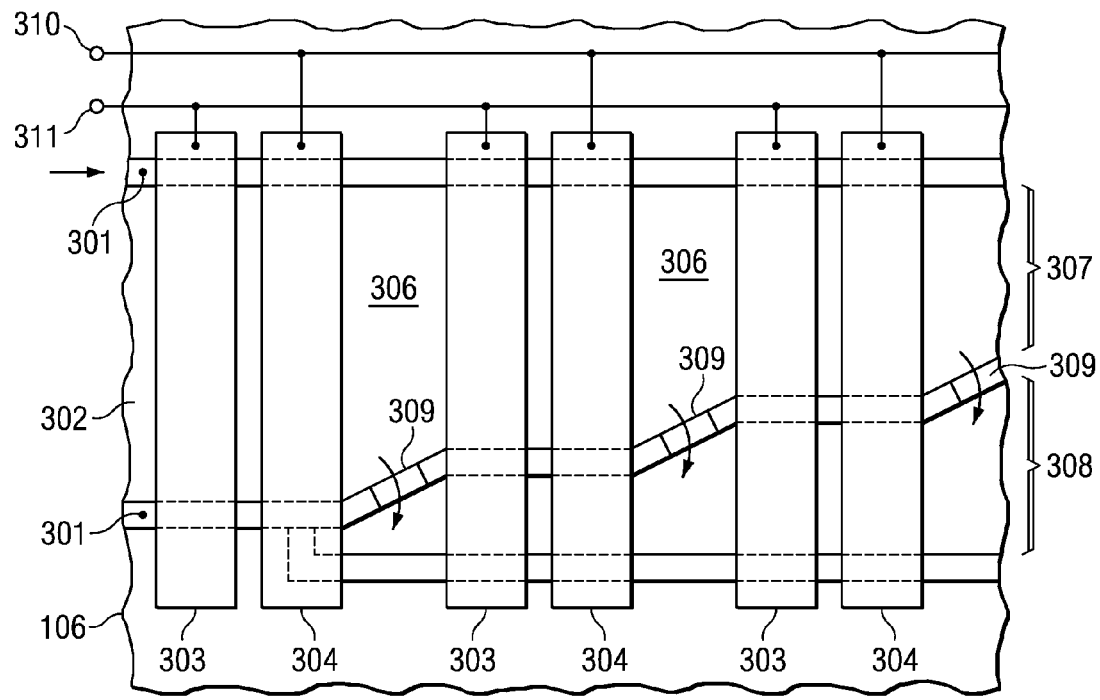
FIG. 3 shows the detail of the charge overflow region illustrating charge separation into a high sensitivity and a low sensitivity CCD channels.

After the charge has been multiplied, it enters charge overflow region 106 whose detail is shown in FIG. 3. Charge channel 302 is again formed by a suitable ion implantation and is defined laterally by channel stops 301. Another feature 309, called Charge Overflow Barrier (COB), has been constructed in the Virtual Phase region 306. The COB regions are contiguous under the gates 303 and 304 with the channel stops 301 to define the high sensitivity channel 307. By splitting off the high sensitivity channel 307 from the original channel 302, a new CCD channel 308 is formed. Since this channel transports only overflow charge and is terminated by the low sensitivity detection node, it is called the low sensitivity channel. Applying suitable pulses to the gates 303, 304 from the terminals 310 and 311 transports the charge through the entire charge overflow region.

Figure 4:
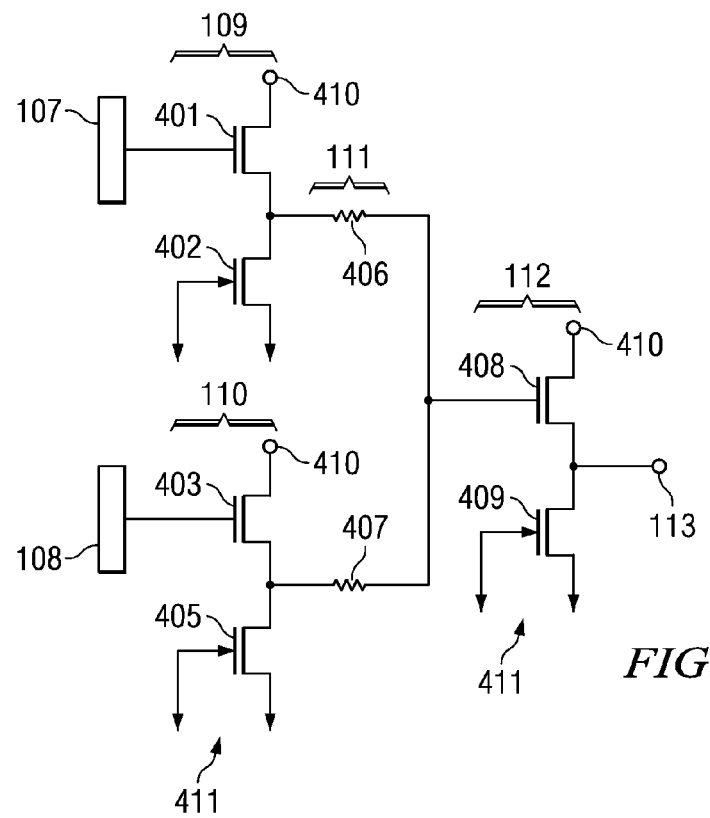
FIG. 4 is a schematic diagram of the detection node amplifiers, summing network, and an buffer stage.
Figure 5:
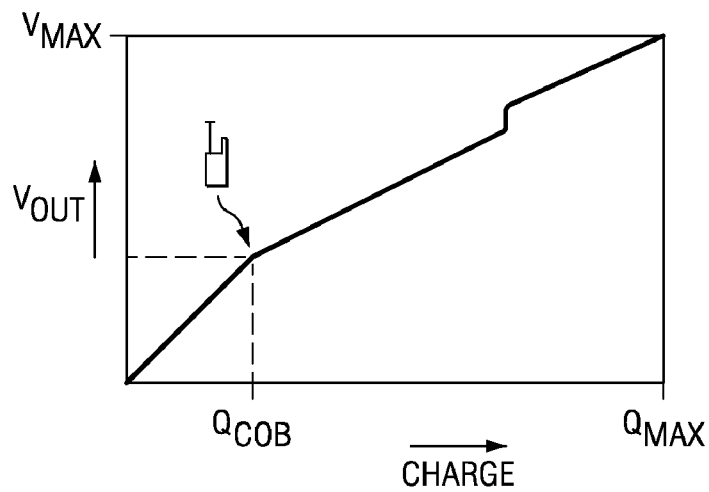
FIG. 5 is a graph showing the dependence of the output voltage on the input charge with the point $Q_{cob}$ where the sensitivity changes form high to low.

After the charge signal has been supplied to the detection nodes 307 and 308 it is converted into voltage increments. There are many different charge detection nodes known in the industry that can be used here. It is immaterial to the function of the described invention, which one is used. In most cases, a suitable buffer amplifier buffers the voltage from the corresponding detection node. This can for example be a source follower circuit 109 and 110 as shown in FIG. 4. An MOS transistor 401 forms the source follower with the current source load 402. The transistor drain is connected to a common drain bias terminal 410. The output from the source follower 109 is connected through the resistor 406 to the gate of the output buffer 112 formed by the transistor 408 and the load 409. Finally the signal is supplied to the device output terminal 113. Similarly as the high sensitivity detection node, the source follower 110, formed by the transistor 403 with the load 405, buffers the low sensitivity detection node. The low sensitivity channel signal is supplied through the resistor 407 to the gate of the output buffer 112. The resistors 406 and 407 form a signal summing network that can add together the signals from the corresponding channels in various proportions By summing the channel signals, as described above, a piecewise linear charge transfer characteristic is obtained. This is indicated in the graph in FIG. 5. For amounts of charge below the limit $Q_{cob}$ only the high sensitivity channel is active and provides output with a higher conversion gain (steeper slope). After the limit L, the high sensitivity channel supplies only a constant output and the system conversion gain becomes lower. A lower conversion gain accommodates a much higher charge $Q_{max}$ for a given maximum allowable output voltage $V_{max}$. The charge DR has been compressed without sacrifice in sensitivity and noise of low light level signals. The separation of the charge into high and low sensitivity channels in the charge domain is one of the key features of this invention that achieves the high DR without saturation of the charge detection nodes and output amplifiers.

Figure 6:
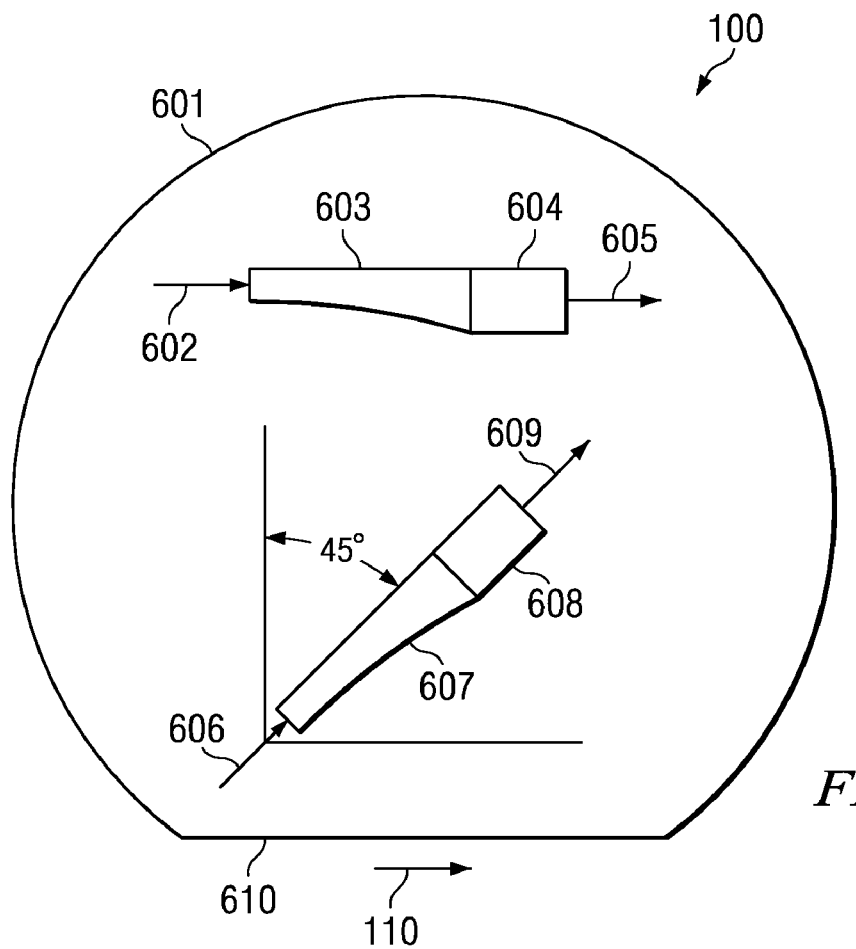
FIG. 6 shows two possible orientations of CCD registers with respect to principal crystallographic directions of the substrate wafer.

Finally, to optimize charge multiplier performance itself either by minimizing charge multiplication pulse amplitudes or by minimizing multiplication noise, several possible orientations of CCD registers with respect to the principal wafer crystallographic directions are shown in the drawing in FIG. 6. The circle 601 with a cut flat portion 610 represents a semiconductor substrate. The substrate is typically fabricated in a (100) plane and the direction of the flat is in the <110> direction. There are two possible distinct orientations for the CCD registers containing multipliers. Orientation 603 with the register along the <110> direction and orientation 607 with the register at 45 degrees with respect to the flat. The charge inputs 602 and 606 are provided by the CCD arrays and they can be at any orientation. Similarly charge-overflow regions 604 and 608 as well as the outputs 605 and 609 can be at any orientation. In case that the substrate is fabricated in the (111) plane the orientation of registers has no effect on noise or on pulse amplitudes. Other combinations of wafer planes and register directions are possible and easily deduced by those skilled in the art.

Having described preferred embodiments of a novel semiconductor image sensor with high DR readout and low noise, which are intended to be illustrative and not limiting, it is noted that modifications and variations may be made by persons skilled in the art in light of the above teachings. It is therefore to be understood that changes may be made in the particular embodiments of the invention disclosed which are within the scope and spirit of the invention as defined by the appended claims.

What is claimed is:

1. A solid-state image sensor having a readout architecture that incorporates charge multipliers, said image sensor including:
    a first CCD register adjacent to at least a second CCD register and coupled to the said first register through a charge overflow barrier, where charge may overflow during transfer, the width of the CCD registers varies in proportion to the increasing amount of charge depending on the number of CCD stages that include charge multiplication devices.

2. The image sensor according to claim 1 wherein the second adjacent CCD register collects overflow charge and transports it to at least one detection node located in each register, and each charge detection node having charge conversion sensitivity that may be different for each node.

3. The image sensor according to claim 2, wherein signals from adjacent register detection nodes are processed and combined according to a predetermined mathematical formula.

4. A solid-state image sensor having a readout architecture that incorporates charge multipliers, said image sensor including:
   a CCD register that incorporates at least one charge-multiplication device element in at least one stage and said at least one stage has a progressively wider width;
wherein the width of the CCD register-stages and the number of charge-multiplication elements in at least some of its stages varies according to a predetermined formula.

5. The image sensor according to claim 4, wherein the predetermined formula has an exponential dependency on the number of CCD stages that include charge multiplication devices.

6. The image sensor according to claim 4, wherein the CCD register has a charge overflow barrier and a charge overflow drain incorporated in at least one of its stages to prevent charge blooming in the direction of charge transfer.

7. A solid-state image sensor having a readout architecture, said readout architecture incorporating:
   charge multipliers;
   CCD registers; and
   a charge overflow device in at least one of its registers;
wherein the width of the CCD register-stages and the number of charge-multiplication elements in at least some of its stages varies according to a predetermined formula which has an exponential dependency on the number of CCD stages that include charge multiplication devices.

* * * * *